United States Patent [19]

Shimizu

[11] Patent Number: 4,639,757
[45] Date of Patent: Jan. 27, 1987

[54] POWER TRANSISTOR STRUCTURE HAVING AN EMITTER BALLAST RESISTANCE

[75] Inventor: Isao Shimizu, Takasaki, Japan

[73] Assignee: Hitachi, Ltd., Tokyo, Japan

[21] Appl. No.: 329,948

[22] Filed: Dec. 11, 1981

[30] Foreign Application Priority Data

Dec. 12, 1980 [JP] Japan ................... 55-174499

[51] Int. Cl.⁴ .............. H01L 29/72; H01L 27/02; H01L 23/48
[52] U.S. Cl. ........................... 357/36; 357/34; 357/46; 357/51; 357/68
[58] Field of Search ............ 357/36, 51, 89, 46; 356/68, 34

[56] References Cited

U.S. PATENT DOCUMENTS

| | | | |
|---|---|---|---|
| 3,358,197 | 12/1967 | Scarlett | 357/36 |
| 3,609,460 | 9/1971 | Ollendorf | 357/36 |
| 3,704,177 | 11/1972 | Beale | 357/89 |
| 3,810,123 | 3/1974 | Baitinger et al. | 357/36 |
| 3,884,732 | 5/1975 | Baitinger et al. | 357/36 |
| 3,913,123 | 10/1975 | Masaki et al. | 357/36 |
| 4,049,975 | 9/1977 | Colaco | 357/36 |
| 4,149,177 | 4/1979 | Alter | 357/51 |
| 4,151,540 | 4/1979 | Sander et al. | 357/89 |
| 4,315,271 | 2/1982 | Roger | 357/89 |

FOREIGN PATENT DOCUMENTS 0019355 11/1980 European Pat. Off. ............ 357/36
1291418 3/1979 Fed. Rep. of Germany.

Primary Examiner—J. Carroll
Attorney, Agent, or Firm—Antonelli, Terry & Wands

[57] ABSTRACT

In a semiconductor device a power transistor is equipped with a ballast resistance formed in the same semiconductor layer which forms the emitter regions which perform the bipolar transistor operation. Due to this ballast resistance and an electrode extension portion also formed in the emitter semiconductor layer, an undesirable parasitic transistor is also formed in the semiconductor device. This parasitic transistor is comprised of an emitter formed by the ballast resistor and the electrode extension portion, and the base and collector regions of the bipolar transistor layers which are immediately below the ballast resistor and the electrode extension portion. Accordingly, means are disposed in the layer forming the base region for reducing the current gain of the parasitic transistor. This current gain reducing means can include either an expanded width base portion or a higher impurity concentration base portion in the parasitic transistor region.

16 Claims, 7 Drawing Figures

POWER TRANSISTOR STRUCTURE HAVING AN EMITTER BALLAST RESISTANCE

BACKGROUND OF THE INVENTION

This invention relates to a semiconductor device, and more particularly to a power transistor adapted to a high power semiconductor integrated circuit device (hereinafter referred to as a "power IC").

In the power transistor in a power IC for use in an audio output circuit or the like, it is customary practice to divide an emitter region into a plurality of regions and arrange them in one base region in order to obtain a high output current. In such a power transistor, a ballast resistance is inserted between each emitter region and the one emitter input terminal so that the emitter current flows uniformly through the plurality of divided emitter regions. As a method of forming this ballast resistance, it is conceivable in principle to form a resistance region with one end continuous with the emitter regions and the other end connected to the emitter input electrode. This would reduce the area occupied by the power transistor. However, according to the results of experiments carried out for such a construction by the inventor of the present invention, it has been found that the input electrode side of the resistance region and the resistance region function as transistors. As a result of this, the transistor formed by the emitter regions of the original transistor and the parasitic transistor formed by the resistance region exist together in the substrate. This leads to local current concentration in the parasitic transistor due to the ballast resistance region, which, in turn, leads to a breakdown of the transistor.

SUMMARY OF THE INVENTION

Accordingly, objects of the present invention are to improve the break-down strength and to increase the area of safe operation of a power transistor using a part of its emitter regions as a ballast resistance.

According to the present invention, the ballast resistance is formed in the base region as the same semiconductor region continuous with the emitter region performing the original transistor operation. In particular, additional means is disposed in the device in order to reduce the current gain of a parasitic transistor formed by the ballast resistance region and the base and collector regions immediately below the ballast resistance region. As the most preferred embodiment of the additional means, a semiconductor region for increasing the base width of the parasitic transistor portion is added.

BRIEF DESCRIPTION OF THE DRAWINGS

The accompanying drawings illustrate some preferred embodiments of the present invention, wherein.

DESCRIPTION OF THE PREFERRED EMBODIMENTS

Figure 1:
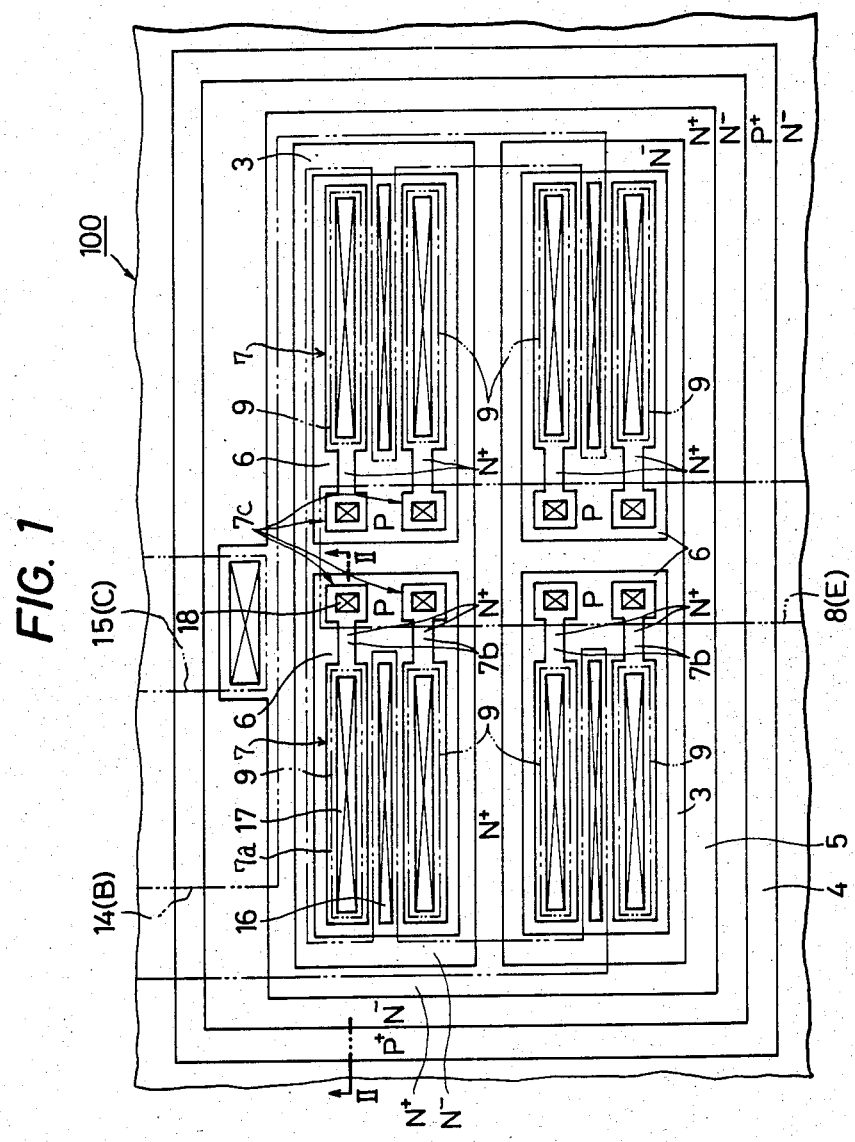
FIG. 1 is a plan view showing the power transistor portion of the power IC.
Figure 2:
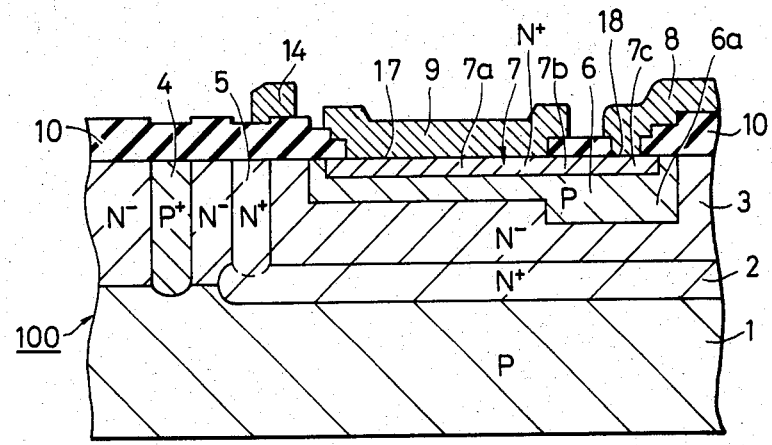
FIG. 2 is a sectional view showing a partial section of FIG. 1.

FIGS. 1 and 2 depict the structure of the power transistor in accordance with the present invention, with FIG. 1 being a plan view and FIG. 2 being a sectional view of the power transistor taken along line II—II of FIG. 1. The power transistor formed as a part of a power IC is illustrated in this particular embodiment. In FIGS. 1 and 2, the power transistor is formed in a part of a silicon semiconductor wafer 100 consisting of a P-type substrate 1 and an $N^{-1}$-type epitaxial layer 3 formed on the substrate by epitaxial techniques. The portion (island region) in which the power transistor is to be formed is encompassed by an isolation region 4 and is electrically isolated from other circuit elements (not shown) that are to be formed on other portions of the semiconductor wafer 100. The power transistor will be described in further detail in the following paragraphs.

In the epitaxial layer 3 encompassed by a P+ isolation region 4, an annular N+ diffusion layer 5 is formed, with a deeply extending collector electrode that reaches a buried layer 2. P base regions 6 are formed inside the diffusion layer 5 by known diffusion techniques. As shown in the plan view of FIG. 1, four base regions 6 are formed in one island region 3 and adjacent pairs of base regions 6 are encompassed by the above-mentioned annular N+ region 5. An N+ emitter region 7 is formed in each base region 6. As can be seen clearly from FIG. 1, a pair of upper and lower emitter regions 7 are formed in one base region 6. Each emitter region 7 consists of an emitter portion 7a being formed to perform the original transistor operation, a resistance portion 7b serving as the ballast resistance and an electrode extension portion 7c with which an aluminum electrode 8 serving as an emitter input terminal comes into contact. The electrode extension portion 7c contacts the electrode 8 through a contact hole 18 of a silicon oxide film 10. As schematically represented by the dot and chain line in FIG. 1, this electrode 8 is connected in common with the emitter regions via the contact holes 18, thereby forming the emitter input terminal. An aluminum emitter electrode 9 contacts the emitter portion 7a of the transistor operation portion via a contact hole 17. An emitter electrode 9 is disposed for each emitter portion independently of the other. An aluminum base electrode 14 contacts the base region 6 between a pair of emitter regions 7 via a contact hole 16. As schematically represented by the dot and chain line in FIG. 1, the base electrode 14 is disposed so as to connect the base contact regions in common, thereby forming the base input terminal.

Figure 3:
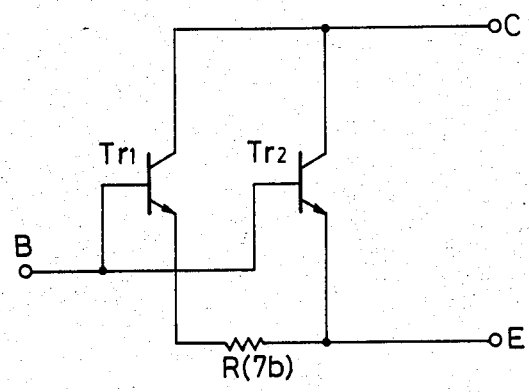
FIG. 3 is an equivalent circuit diagram in the unit structure of the power transistor.

FIG. 3 is an equivalent circuit diagram of a transistor formed for one emitter region 7 of the above-mentioned power transistor. Symbol $Tr_1$ represents a transistor formed by the emitter portion 7a which is the originally intended transistor. On the other hand, $Tr_2$ represents an undesirable parasitic transistor which is formed by the electrode extension portion 7c in contact with the emitter electrodes 8 as shown in FIG. 2. Symbol R represents a ballast resistance formed by the resistance portion 7b.

Figure 4:
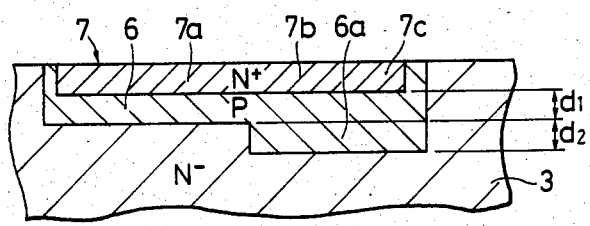
FIG. 4 is a schematic sectional view useful for explaining the structure of FIG. 2.

To minimize the effect of this parasitic transistor $Tr_2$, in accordance with the embodiment shown in FIGS. 2 and 4, the region 6a of the base region 6 below the ballast resistance portion 7b of the emitter region 7 and the electrode extension portion 7c is formed so as to protrude downwardly so that the effective base width of the parasitic transistor Tr$_2$ is increased in comparison with the width of the other portions. If the original base width d$_1$ is about 1 μm, for instance, the protrusive width d$_2$ of the increased width portion of the base 6a may be about 1 μm and the length of protrusion may be such a depth as to provide a withstand voltage as shown in FIG. 4.

As described above, the current gain h$_{FE}$ of the parasitic transistor Tr$_2$ can be reduced by increasing its base width. Accordingly, current concentration on that portion during the transistor operation can effectively be prevented and it becomes possible to flow current through the original transistor Tr$_1$. Moreover, since the original transistor Tr$_1$ has the ordinary base width, its characteristics are not deteriorated. The emitter ballast resistance prevents current concentration in the specific emitter region or regions 7a and the current is uniformly distributed to the emitters of the divided emitter regions. Accordingly, the break-down strength of the transistor as a whole or as a power transistor can be markedly improved and the characteristics of the original transistor can be maintained satisfactorily due to the existence of the base width expanded portion 6a.

This base width expanded portion 6a may be formed longitudinally as a whole with respect to one base region 6 in FIG. 1. Alternatively, it may be disposed so as to correspond to each emitter region of a pair of transistors formed inside one base region 6. The base width expanded portion 6a may be formed by forming a P+ region in advance at a position corresponding to the base width expanded portion 6a by a diffusion technique or an ion-implantation technique and then performing the base diffusion. This P+ region can be formed simultaneously with the formation of a P+ region that forms one of regions for a lateral PNP transistor or a Zener diode to be formed inside other element regions.

Figure 5:
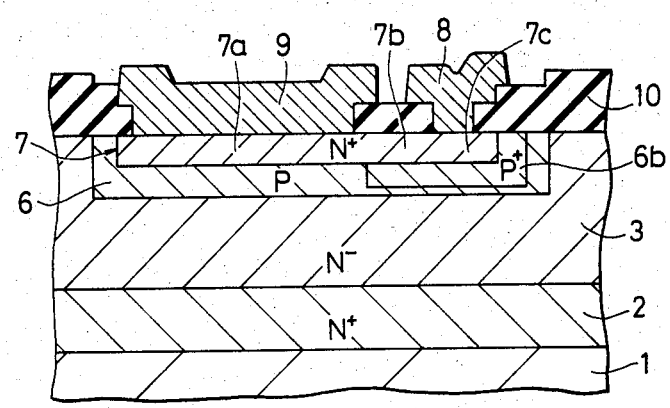
FIG. 5 is a sectional view of the power transistor portion in another embodiment of the present invention.
Figure 6A:
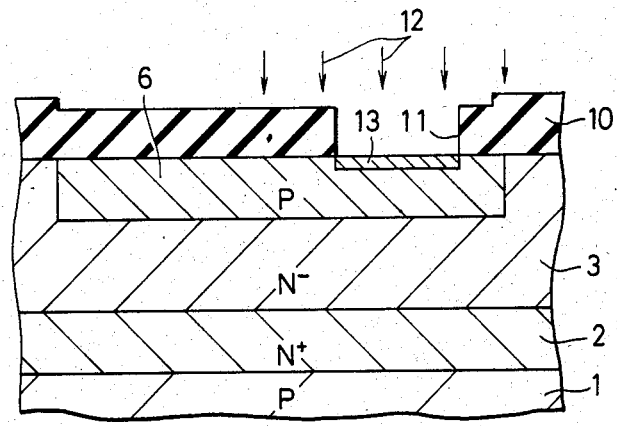
FIGS. 6A and 6B are sectional views showing the principal steps in fabricating the power transistor.
Figure 6B:
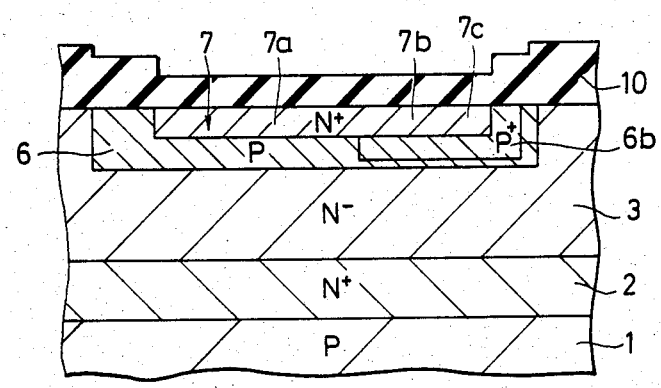

FIGS. 5, 6A and 6B illustrate another embodiment in accordance with the present invention, in which the same reference numerals are used to identify the same constituents as in the above embodiment and explanation of such similar constituents is related.

In this embodiment, the base width is uniform for both transistors Tr$_1$ and Tr$_2$, as shown in FIG. 5. However, a P+ region 6b of a relatively higher concentration tha the other base regions is formed at a part of the base region 6 of the parasitic transistor Tr$_2$. In consideration of the collector-to-base withstand voltage, it is preferred that this P+ region 6b be disposed in an intermediate depth of the base region 6 so that it does not come into contact with the collector region 3, although it does not contact the emitter region 7.

The P+ region 6b can be formed in the following manner. First, as shown in FIG. 6A, the base region 6 is formed by the diffusion technique and a part of the SiO$_2$ film 10 is removed by etching. A P type impurity such as boron ions 12 is then implanted into a region corresponding to the parasitic transistor through the aperture 11 thus defined, in a dose of about $5 \times 10^{13-14}$ cm$^{-2}$, for example. Next, after a window for impurity introduction is formed in the SiO$_2$ film 10, an impurity diffusion is achieved in order to form the ordinary emitter region 7 as shown in FIG. 6B. Simultaneously with the diffusion of this emitter region 7, the P type impurity in the ion implantation region 13 is pushed below the emitter region 7. Thus, the P+ type region 6b locally expanding in the base region 6 is formed immediately below the resistance portion 7b and contact portion 7c of the emitter region and around their periphery. This P+ type region 6b has a higher concentration than that of the original base region 6 and has a seat resistance of up to 200 Ω/□, for instance, but the resistance is smaller than that of the other base regions.

In the above-mentioned manner, if the high concentration region 6b is disposed inside the base region of the parasitic transistor, h$_{FE}$ of the parasitic transistor Tr$_2$ can be reduced so that current concentration can be prevented and the break-down strength can be improved. Since the P+ type region 6b does not affect the other base regions, the characteristics of the original transistor are not deteriorated. Further, since this P+ type region 6b is formed after passing through the above-mentioned ion implantation process, its impurity concentration has a higher concentration peak on the side closer to the emitter side than the other base regions. As the result of this, the region 6b contributes to reduce h$_{FE}$ of the parasitic transistor Tr$_2$.

Though the present invention has thus been described with reference to the preferred embodiments thereof, the embodiments can be further modified on the basis of the technical concept of the present invention. For example, the position, shape and size of the base width expanded portion 6a and the high concentration region may be changed in various manners, as may the methods of forming them. The current gain can also be controlled by increasing the impurity concentration of the expanded portion 6a. Furthermore, another region or regions or means for reducing the current path gain may be formed on the base of the parasitic transistor. Additionally, the present invention can be applied to form a PNP transistor by changing the semiconductivity type of each of the above-mentioned semiconductor regions.

As described in the foregoing, since the means for reducing the current gain is disposed at the base portion of the region that may be provided by the parasitic transistor in the present invention, it becomes possible to prevent current concentration in the parasitic transistor and to improve the break-down strength of the transistor as a whole so the transistor of the present invention can operate in a satisfactory manner without deteriorating the characteristics of the original transistor. Thus, the present invention is capable of providing a semiconductor device which is extremely useful especially as a power transistor.

It is to be understood that the above-described arrangements are simply illustrative of the application of the principles of this invention. Numerous other arrangements may be readily devised by those skilled in the art which embody the principles of the invention and fall within its spirit and scope.

I claim:

1. A semiconductor device including a bipolar transistor and a parasitic transistor, said semiconductor device comprising:
   a first semiconductor region of a first conductivity type to serve as a collector region of said bipolar and parasitic transistors;
   a second semiconductor region of a second conductivity type to serve as a base region for said bipolar and parasitic transistors, said second semiconductor region being formed adjacent to said first semiconductor region; and a third semiconductor region of said first conductivity type to serve as an emitter region for said bipolar and parasitic transistors, said third semiconductor region being formed adjacent to said second semiconductor region, wherein said third semiconductor region comprises an operating portion for forming the emitter of the bipolar transistor, and a ballast resistance portion and a terminal portion which form the emitter of the parasitic transistor, and further wherein said ballast resistance portion is surrounded by said second semiconductor region and the effective base width of said parasitic transistor is greater than the base width of the bipolar transistor base region in the base region portion of said parasitic transistor adjacent to said terminal portion of said third semiconductor layer to reduce a current gain of the parasitic transistor, and wherein said semiconductor device further comprises a base contact portion formed in said second semiconductor region to extend adjacent to said operating portion of said emitter region of said bipolar transistor but not extending adjacent to said ballast resistance portion and said terminal portion, an emitter input terminal electrode formed to contact said emitter terminal portion, a metal contact stripe formed to contact said emitter operating portion and spaced from said emitter input terminal electrode, a base input terminal electrode formed to contact said base contact region along said metal contact stripe so that said emitter input terminal electrode and said base input terminal electrode are spaced apart from one another, and wherein an emitter-base junction located between said emitter terminal portion and said base region is located more closely adjacent to said emitter terminal portion than to said base contact region.

2. The semiconductor device as set forth in claim 1, wherein the effective base width of said parasitic transistor is approximately twice the base width of the bipolar transistor base region.

3. The semiconductor device as set forth in claim 1, wherein the second semiconductor region is formed within the first semiconductor region and the third semiconductor region is formed within the second semiconductor region.

4. A semiconductor device including a bipolar transistor and a parasitic transistor, said semiconductor device comprising:
 a first semiconductor region of a first conductivity type to serve as a collector region of said bipolar and parasitic transistors;
 a second semiconductor region of a second conductivity type to serve as a base region for said bipolar and parasitic transistors, said second semiconductor region being formed adjacent to said first semiconductor region; and
 a third semiconductor region of said first conductivity type to serve as an emitter region for said bipolar and parasitic transistors, said third semiconductor region being formed adjacent to said second semiconductor region, wherein said third semiconductor region comprises an operating portion for forming the emitter of the bipolar transistor and a ballast resistance portion and a terminal portion which form the emitter of the parasitic transistor, and further wherein said ballast resistance portion is surrounded by said second semiconductor region and the impurity concentration of the base region of said parasitic transistor is higher than that of the bipolar transistor base region in the base region portion of said parasitic transistor adjacent to said terminal portion of said third semiconductor layer to reduce a current gain of said parasitic transistor, and wherein said semiconductor device further comprises a base contact portion formed in said second semiconductor region to extend adjacent to said operating portion of said emitter region of said bipolar transistor but not extending adjacent to said ballast resistance portion and said terminal portion, an emitter input terminal electrode formed to contact said emitter terminal portion, a metal contact stripe formed to contact said emitter operating portion and spaced from said emitter input terminal electrode, a base input terminal electrode formed to contact said base contact region along said metal contact stripe so that said emitter input terminal electrode and said base input terminal electrode are spaced apart from one another, and wherein an emitter-base junction located between said emitter terminal portion and said base region is located more adjacent to said emitter terminal portion than to said base contact region.

5. The semiconductor device as set forth in claim 4, wherein the second semiconductor region is formed within the first semiconductor region and the third semiconductor region is formed within the second semiconductor region.

6. The semiconductor device as set forth in claim 4, wherein said higher impurity concentration base region of said parasitic transistor is formed in said second semiconductor region to underlay said terminal portion of said emitter but not to underlay said operating portion of said emitter, and wherein said higher impurity concentration base region of said parasitic transistor is formed such that it does not directly contact said first semiconductor region.

7. A semiconductor device including a bipolar transistor and a parasitic transistor, said semiconductor device comprising:
 a first semiconductor region of a first conductivity type to serve as a collector region of said bipolar and parasitic transistors;
 a second semiconductor region of a second conductivity type to serve as a base region for said bipolar and parasitic transistors, said second semiconductor region being formed adjacent to said first semiconductor region; and
 a third semiconductor region of said first conductivity type to serve as an emitter region for said bipolar and parasitic transistors, said third semiconductor region being formed adjacent to said second semiconductor region, wherein said third semiconductor region comprises an operating portion for forming the emitter of the bipolar transistor, and a ballast resistance portion and a terminal portion which form the emitter of the parasitic transistor, and further wherein said ballast resistance portion is surrounded by said second semiconductor region and the impurity concentration of the base region of said parasitic transistor is higher than that of the bipolar transistor base region in the base region portion of said parasitic transistor adjacent to said terminal portion of said third semiconductor layer to reduce a current gain of said parasitic transistor, and wherein said higher impurity concentration base region of said parasitic transistor is formed in said second semiconductor region to underlay said terminal portion of said emitter but not to underlay said operating portion of said emitter, and wherein said higher impurity concentration base region of said parasitic transistor is formed such that it does not directly contact said first semiconductor region, wherein said semiconductor device further comprises a base contact portion formed in said second semiconductor region to extend adjacent to said operating portion of said emitter region of said bipolar transistor but not extending adjacent to said ballast resistance portion and said terminal portion, an emitter input terminal electrode formed to contact said emitter terminal portion, a metal contact stripe formed to contact said emitter operating portion and spaced from said emitter input terminal electrode, a base input terminal electrode formed to contact said base contact region along said metal contact stripe so that said emitter input terminal electrode and said base input terminal electrode are spaced apart from one another, and wherein an emitter-base junction located between said emitter terminal portion and said base region is located more closely adjacent to said emitter terminal portion than to said base contact region.

8. The semiconductor device as set forth in claim 7, wherein the second semiconductor region is formed within the first semiconductor region and the third semiconductor region is formed within the second semiconductor region.

9. A semiconductor device including at least first and second bipolar transistors and first and second parasitic transistors, said semiconductor device comprising:

a first semiconductor region of a first conductivity type to serve as a common collector region of said first and second bipolar and said first and second parasitic transistors;

a second semiconductor region of a second conductivity type to serve as a common base region for said first and second bipolar and said first and second parasitic transistors, said second semiconductor region being formed adjacent to said first semiconductor region;

a third semiconductor region of said first conductivity type to serve as an emitter region for said first bipolar and said first parasitic transistors, said third semiconductor region being formed adjacent to said second semiconductor region; and a fourth semiconductor region of said first conductivity type to serve as an emitter region for said second bipolar and said second parasitic transistors, said fourth semiconductor region being formed adjacent to said second semiconductor region, wherein said third semiconductor region comprises an operating portion for forming the emitter of the first bipolar transistor, and a ballast resistance portion and a terminal portion which form the emitter of the first parasitic transistor, and further wherein said ballast resistance portion is surrounded by said second semiconductor region and the effective base width of said first parasitic transistor is greater than the base width of the first bipolar transistor base region in the base region portion of said first parasitic transistor adjacent to said terminal portion of said third semiconductor layer to reduce a current gain of the first parasitic transistor, wherein said fourth semiconductor region comprises an operating portion for forming the emitter of the second bipolar transistor, and a ballast resistance portion and a terminal portion which form the emitter of the second parasitic transistor, and further wherein the effective base width of said second parasitic transistor is greater than the base width of the second bipolar transistor base region in the base region portion of said second parasitic transistor adjacent to said terminal portion of said fourth semiconductor layer to reduce a current gain of the second parasitic transistor, and wherein said semiconductor device further comprises a base contact portion formed in said second semiconductor region between said third and fourth semiconductor regions to extend adjacent to said operating portions of said emitter regions of said first and second bipolar transistors but not extending adjacent to said ballast resistance portions and said terminal portions of said third and fourth regions, an emitter input terminal electrode formed to contact said emitter terminal portions of both said third and fourth regions, metal contact stripes respectively formed to contact said emitter operating portions of said third and fourth regions, and a base input terminal electrode formed to contact said base contact portion along said metal contact stripes so that said emitter input terminal electrode and said base input terminal electrode are spaced apart from one another, and wherein emitter-base junctions located between said emitter terminal portion and said base region are located more closely adjacent to said emitter terminal portion than to said base contact region.

10. The semiconductor device as set forth in claim 9, wherein the second semiconductor region is formed within the first semiconductor region and the third and fourth semiconductor regions are formed within the second semiconductor region.

11. A semiconductor device including at least first and second bipolar transistors and first and second parasitic transistors, said semiconductor device comprising:

a first semiconductor region of a first conductivity type to serve as a common collector region of said first and second bipolar and said first and second parasitic transistors;

a second semiconductor region of a second conductivity type to serve as a common base region for said first and second bipolar and said first and second parasitic transistors, said second semiconductor region being formed adjacent to said first semiconductor region;

a third semiconductor region of said first conductivity type to serve as an emitter region for said first bipolar and said first parasitic transistors, said third semiconductor region being formed adjacent to said second semiconductor region;

a fourth semiconductor region of said first conductivity type to serve as an emitter region for said second bipolar and said second parasitic transistors, said fourth semiconductor region being formed adjacent to said second semiconductor region, wherein said third semiconductor region comprises an operating portion for forming the emitter of the first bipolar transistor, and a ballast resistance portion and a terminal portion which form the emitter of the first parasitic transistor, and further wherein said ballast resistance portion is surrounded by said second semiconductor region and the impurity concentration of the base region of said first parasitic transistor is higher than that of the first bipolar transistor base region in the base region portion of said first parasitic transistor adjacent to said terminal portion of said third semiconductor layer to reduce a current gain of the first parasitic transistor, wherein said fourth semiconductor region comprises an operating portion for forming the emitter of the second bipolar transistor, and a ballast resistance portion and a terminal portion which form the emitter of the second parasitic transistor, and further wherein the impurity concentration of the base region of said second parasitic transistor is greater than that of the second bipolar transistor base region in the base region portion of said second parasitic transistor adjacent to said terminal portion of said fourth semiconductor layer to reduce a current gain of the second parasitic transistor, and wherein said semiconductor device further comprises a base contact portion formed in said second semiconductor region between said third and fourth semiconductor regions to extend adjacent to said operating portions of said emitter regions of said first and second bipolar transistors but not extending adjacent to said ballast resistance portions and said terminal portions of said third and fourth regions, an emitter input terminal electrode formed to contact said emitter terminal portions of both said third and fourth regions, metal contact stripes respectively formed to contact said emitter operating portions of said third and fourth regions, and a base input terminal electrode formed to contact said base contact portion along said metal contact stripes so that said emitter input terminal electrode and said base input terminal electrode are spaced apart from one another, and wherein emitter-base junctions located between said emitter terminal portion and said base region are located more closely adjacent to said emitter terminal portion than to said base contact region.

12. The semiconductor device as set forth in claim 11, wherein the second semiconductor region is formed within the first semiconductor region and the third and fourth semiconductor regions are formed within the second semiconductor region.

13. A semiconductor device including at least first and second bipolar transistors and first and second parasitic transistors, said semiconductor device comprising:

a first semiconductor region of a first conductivity type to serve as a common collector region of said first and second bipolar and said first and second parasitic transistors;

a second semiconductor region of a second conductivity type to serve as a base region for said first bipolar and said first parasitic transistors, said second semiconductor region being formed adjacent to said first semiconductor region;

a third semiconductor region of a second conductivity type to serve as a base region for said second bipolar and second parasitic transistors, said third semiconductor region being formed adjacent to said first semiconductor region;

a fourth semiconductor region of said first conductivity type to serve as an emitter for said first bipolar and said first parasitic transistors, said third semiconductor region being formed adjacent to said second semiconductor region; and a fifth semiconductor region of said first conductivity type to serve as an emitter region for said second bipolar and said second parasitic transistors, said fourth semiconductor region being formed adjacent to said third semiconductor region, wherein said fourth semiconductor region comprises an operating portion for forming the emitter of the first bipolar transistor, and a ballast resistance portion and a terminal portion which form the emitter of the first parasitic transistor, and further wherein said ballast resistance portion is surrounded by said second semiconductor region and the effective base width of said first parasitic transistor is greater than the base width of the first bipolar transistor base region in the base region portion of said first parasitic transistor adjacent to said terminal portion of said fourth semiconductor layer to reduce a current gain of the first parasitic transistor, wherein said fifth semiconductor region comprises an operating portion for forming the emitter of the second bipolar transistor, and a ballast resistance portion and a terminal portion which form the emitter of the second parasitic transistor, and further wherein the effective base width of said second parasitic transistor is greater than the base width of the second bipolar transistor base region in the base region portion of said second parasitic transistor adjacent to said terminal portion of said fifth semiconductor layer to reduce a current gain of the second parasitic transistor, and wherein said semiconductor device further comprises a first base contact portion formed in said second semiconductor region to extend adjacent to said operating portion of said emitter of said first bipolar transistor but not extending adjacent to said ballast resistance portion and said terminal portion of said fourth region, a second base contact portion formed in said third semiconductor region to extend adjacent to said operating portion of said emitter of said second bipolar transistor but not extending adjacent to said ballast resistance portion and said terminal portion of said fifth region, a common emitter input terminal electrode formed to contact said emitter terminal portion of both said fourth and fifth semiconductor regions, metal contact stripes respectively formed to contact said emitter operating portions of said fourth and fifth semiconductor regions, and a common base input terminal electrode formed to contact said first and second base contact portions so that said common emitter input terminal electrode and said common base input terminal electrode are spaced apart from one another, and wherein emitter-base junctions located between said emitter terminal portions and said base region portions aere located more closely adjacent to said emitter terminal portion than to said base contact region.

14. The semiconductor device as set forth in claim 13, wherein the second and third semiconductor regions are formed within the first semiconductor region, said fourth semiconductor region is formed within the second semiconductor region and said fifth semiconductor region is formed within the third semiconductor region.

15. A semiconductor device including at least first and second bipolar transistors and first and second parasitic transistors, said semiconductor device comprising:
   a first semiconductor region of a first conductivity type to serve as a common collector region of said first and second bipolar and said first and second parasitic transistors;
   a second semiconductor region of a second conductivity type to serve as a base region for said first bipolar and said first parasitic transistors, said second semiconductor region being formed adjacent to said first semiconductor region;
   a third semiconductor region of a second conductivity type to serve as a base region for said second bipolar and second parasitic transistors, said third semiconductor region being formed adjacent to said first semiconductor region;
   a fourth semiconductor region of said first conductivity type to serve as an emitter region for said first bipolar and said first parasitic transistors, said third semiconductor region being formed adjacent to said second semiconductor region; and
   a fifth semiconductor region of said first conductivity type to serve as an emitter region for said second bipolar and said second parasitic transistors, said fourth semiconductor region being formed adjacent to said third semiconductor region,
   wherein said fourth semiconductor region comprises an operating portion for forming the emitter of the first bipolar transistor, and a ballast resistance portion and a terminal portion which form the emitter of the first parasitic transistor, and further wherein said ballast resistance portion is surrounded by said second semiconductor region and the impurity concentration of the base region of said first parasitic transistor is higher than that of the first bipolar transistor base region in the base region portion of said first parasitic transistor adjacent to said terminal portion of said fourth semiconductor layer to reduce a current gain of the first parasitic transistor,
   wherein said fifth semiconductor region comprises an operating portion for forming the emitter of the second bipolar transistor, and a ballast resistance portion and a terminal portion which form the emitter of the second parasitic transistor, and further wherein the impurity concentration of the base region of said second parasitic transistor is higher than that of the second bipolar transistor base region in the base region portion of said second parasitic transistor adjacent to said terminal portion of said fifth semiconductor layer to reduce a current gain of the second parasitic transistor, and
   wherein said semiconductor device further comprises a first base contact portion formed in said second semiconductor region to extend adjacent to said operating portion of said emitter of said first bipolar transistor but not extending adjacent to said ballast resistance portion and said terminal portion of said fourth region, a second base contact portion formed in said third semiconductor region to extend adjacent to said operating portion of said emitter of said second bipolar transistor but not extending adjacent to said ballast resistance portion and said terminal portion of said fifth semiconductor region, a common emitter input terminal electrode formed to contact said emitter terminal portions of both said fourth and fifth semiconductor regions, metal contact stripes respectively formed to contact said emitter operating portions of said fourth and fifth semiconductor regions, and a common base input terminal electrode formed to contact said first and second base contact portions so that said common emitter input terminal electrode and said common base input terminal electrode are spaced apart from one another, and
   wherein emitter-base junctions located between said emitter terminal portion and said base region portions are located more closely adjacent to said emitter terminal portion than to said base contact region.

16. The semiconductor device as set forth in claim 15, wherein the second and third semiconductor regions are formed within the first semiconductor region, said fourth semiconductor region is formed within the second semiconductor region and said fifth semiconductor region is formed within the third semiconductor region.

* * * * *